US 9,461,045 B1

(12) United States Patent
Asano et al.

(10) Patent No.: US 9,461,045 B1
(45) Date of Patent: Oct. 4, 2016

(54) SEMICONDUCTOR DEVICES

(71) Applicant: Micron Technology, Inc., Boise, ID (US)

(72) Inventors: Shintaro Asano, Tokyo (JP); Yusuke Sakito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/750,139

(22) Filed: Jun. 25, 2015

(51) Int. Cl.
*H01L 27/02* (2006.01)
*H01L 27/092* (2006.01)
*H01L 29/78* (2006.01)
*H01L 23/535* (2006.01)
*H01L 29/06* (2006.01)

(52) U.S. Cl.
CPC ........... *H01L 27/092* (2013.01); *H01L 23/535* (2013.01); *H01L 29/0692* (2013.01); *H01L 29/78* (2013.01)

(58) Field of Classification Search
CPC ............. H01L 27/092; H01L 27/0925; H01L 27/0207
USPC ................................................. 257/369, 401
See application file for complete search history.

(56) References Cited

U.S. PATENT DOCUMENTS

| 5,812,443 | A | 9/1998 | Lee et al. |
| 7,034,364 | B2 * | 4/2006 | Steinhoff ............ H01L 29/4238 257/360 |
| 7,323,727 | B2 | 1/2008 | Kitsukawa et al. |
| 7,511,345 | B2 * | 3/2009 | Van Camp .......... H01L 27/0277 257/173 |
| 7,691,713 | B2 | 4/2010 | Tanaka et al. |
| 8,569,841 | B2 * | 10/2013 | Becker ................ H01L 27/0207 257/401 |
| 2015/0035054 | A1 | 2/2015 | Nishizaki |

* cited by examiner

*Primary Examiner* — Mark Prenty
(74) *Attorney, Agent, or Firm* — Wells St. John P.S.

(57) ABSTRACT

Some embodiments include a semiconductor device having two gate electrodes which are of about a same gate width as one another, and having a first diffusion region between the two gate electrodes. The semiconductor device also has second and third diffusion regions on opposing sides of the two gate electrodes from one another and which sandwich the two gate electrodes and the first source/drain region therebetween. Each of the second and third diffusion regions is longer than the first diffusion region in a direction of the gate width. Some embodiments include a semiconductor device having a PMOS construction and an NMOS construction, with both constructions having a shorter middle diffusion region sandwiched between a pair of longer outer diffusion regions.

21 Claims, 15 Drawing Sheets

SEMICONDUCTOR DEVICES

TECHNICAL FIELD

Semiconductor devices having transistors with diffusion regions of differing lengths.

BACKGROUND

A continuing goal of integrated circuit design is to increase integration density, and a corresponding goal is to reduce the footprint of specific circuit components. One component commonly utilized in integrated circuits is a transistor. In some applications, paired transistors may be utilized in CMOS (complementary metal oxide semiconductor) constructions, with one of the transistors being PMOS (p-type metal oxide semiconductor) and the other being NMOS (n-type metal oxide semiconductor).

FIGS. 1-3 illustrate an example prior art semiconductor device 900 comprising a PMOS region 902 paired with an NMOS region 904.

The PMOS region 902 includes a pair of gate electrodes 913, and includes diffusion regions 910-912 adjacent the gate electrodes. The diffusion regions correspond to source/drain regions. In some applications, diffusion region 911 is a drain region, and diffusion regions 910 and 912 are source regions. The gate electrodes 913 and diffusion regions 910-912 together form a PMOS transistor 905, which is approximately demarcated with a dashed line 903.

Wiring 914 (for instance, WLIC1 connected to power supply voltage Vdd) is provided proximate the PMOS transistor 905, and is electrically coupled to the outer source/drain regions 910 and 912 through contacts 915 (the contacts are shown with dashed-lines to indicate that they are under other wiring). Additional wiring 916 (for instance, WLIC3) connects to the inner source/drain region 911 through contacts 917. The contacts 915 and 917 may extend through insulative material 918 (shown in FIGS. 2 and 3).

The NMOS region 904 includes a pair of gate electrodes 923, and includes diffusion regions 920-922 adjacent the gate electrodes. The diffusion regions correspond to source/drain regions. In some applications, diffusion region 921 is a drain region, and diffusion regions 920 and 922 are source regions. The gate electrodes 923 and diffusion regions 920-922 together form an NMOS transistor 925, which is approximately demarcated with a dashed line 923.

Wiring 924 (for instance, WLIC2 connected to power supply voltage Vss) is provided proximate the NMOS transistor 925, and is electrically coupled to the outer source/drain regions 920 and 922 through contacts 935. Additional wiring 926 (for instance, WLIC3) connects to the inner source/drain region 921 through contacts 937.

The PMOS and NMOS regions 902 and 904 are supported by a semiconductor substrate 940 (shown in FIGS. 2 and 3). Such semiconductor substrate may comprise, for example, monocrystalline silicon and/or any other suitable semiconductor material. The substrate is shown to comprise a p-type background-doped region 942, and to comprise an n-type doped n-well 944 extending into the p-type doped region. The source/drain regions 910-912 of the PMOS device are within the n-well 944; and the source/drain regions 920-922 of the NMOS device are within the p-type background-doped region 942.

A problem with the prior art design of device 900 can be that parasitic resistance undesirably occurs in the PMOS device along the source diffusion regions 910/912 (as diagrammatically illustrated with resistors 950). Similar parasitic resistance may also problematically occur with respect to the NMOS device, although such is not specifically illustrated in FIG. 1.

It is desired to develop improved devices which alleviate or prevent the problematic parasitic resistance described above. It is also desired to develop improved devices having relatively small footprints suitable for incorporation into highly integrated circuitry.

BRIEF DESCRIPTION OF THE DRAWINGS

FIG. 1 is a diagrammatic top view, and FIGS. 2 and 3 are diagrammatic cross-sectional side views along the lines 2-2 and 3-3 of FIG. 1, respectively.

FIG. 4 is a diagrammatic top view, and FIGS. 5-7 are diagrammatic cross-sectional side views along the lines 5-5, 6-6 and 7-7 of FIG. 4, respectively.

FIG. 8 is a diagrammatic top view, and FIG. 9 is a diagrammatic cross-sectional side view along the line 9-9 of FIG. 8.

FIG. 11 is a diagrammatic top view, and FIG. 12 is a diagrammatic cross-sectional side view along the line 12-12 of FIG. 11.

DETAILED DESCRIPTION OF THE ILLUSTRATED EMBODIMENTS

Figure 1:
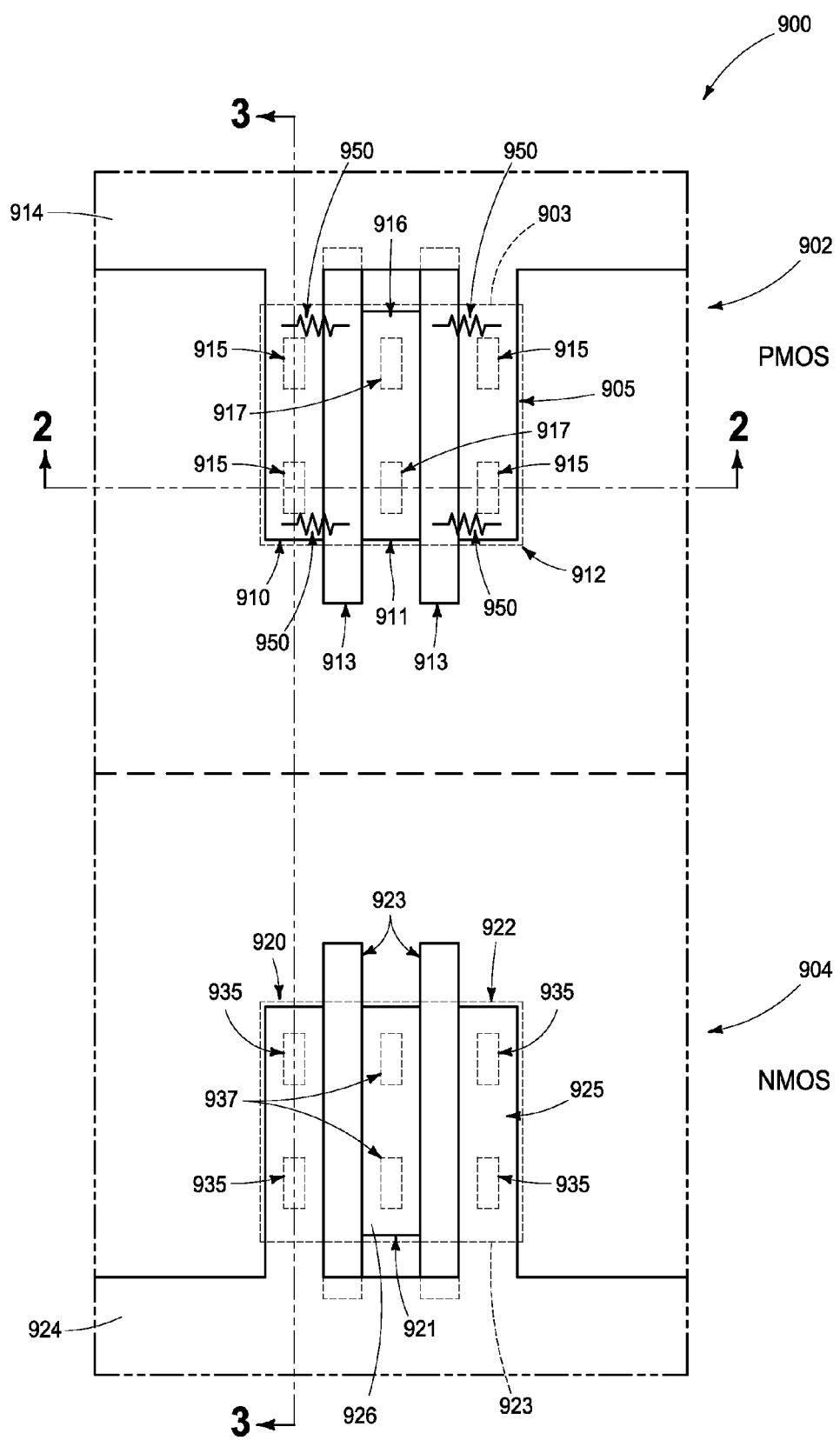
FIGS. 1-3 are views of a prior art semiconductor device.

Some embodiments include transistor constructions having at least two gate electrodes, and having three or more diffusion regions. At least one of the diffusion regions is longer than one or more of the other diffusion regions along a dimension corresponding to a gate width of the gate electrodes. For instance, in some embodiments source diffusion regions are formed to be longer than a drain diffusion region to reduce parasitic resistance on a source side of a transistor. Example embodiments are described below with reference to FIGS. 4-15.

Referring to FIG. 4-7, a semiconductor device (i.e., construction) 10 is shown to comprise a PMOS region 12 paired with an NMOS region 14.

The PMOS region 12 includes a pair of gate electrodes 16, and includes diffusion regions 17-19 adjacent the gate electrodes. The diffusion regions correspond to source/drain regions. The region 18 may be referred to as a first diffusion region between electrodes 16, and the regions 17 and 19 may be referred to as second and third diffusion regions on opposing sides of the electrodes 16. The diffusion regions 17 and 19 sandwich the electrodes 16 and the first diffusion region 18 between them.

The diffusion regions 17-19 correspond to source/drain regions. The first diffusion region 18 is a first kind corresponding to either a source region or a drain region, and the second and third diffusion regions 17 and 19 are both a second kind, different from the first kind, and corresponding to either source regions or drain regions. For instance, in some applications diffusion region 18 is a drain region, and diffusion regions 17 and 19 are source regions.

The electrodes 16 have gate widths "W" extending along a direction corresponding to an axis 5. In the shown embodiment, both electrodes have about the same gate width as one another. The electrodes 16 may be electrically coupled with one another, or may be operated independently of one another.

Figure 2:
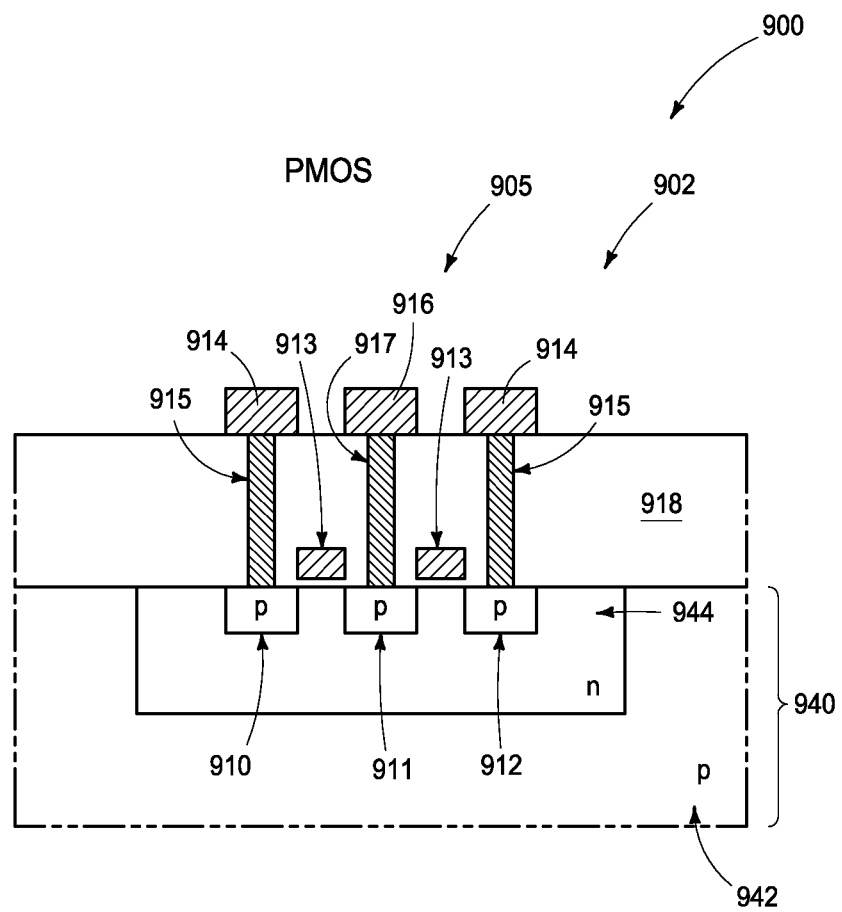
Figure 3:
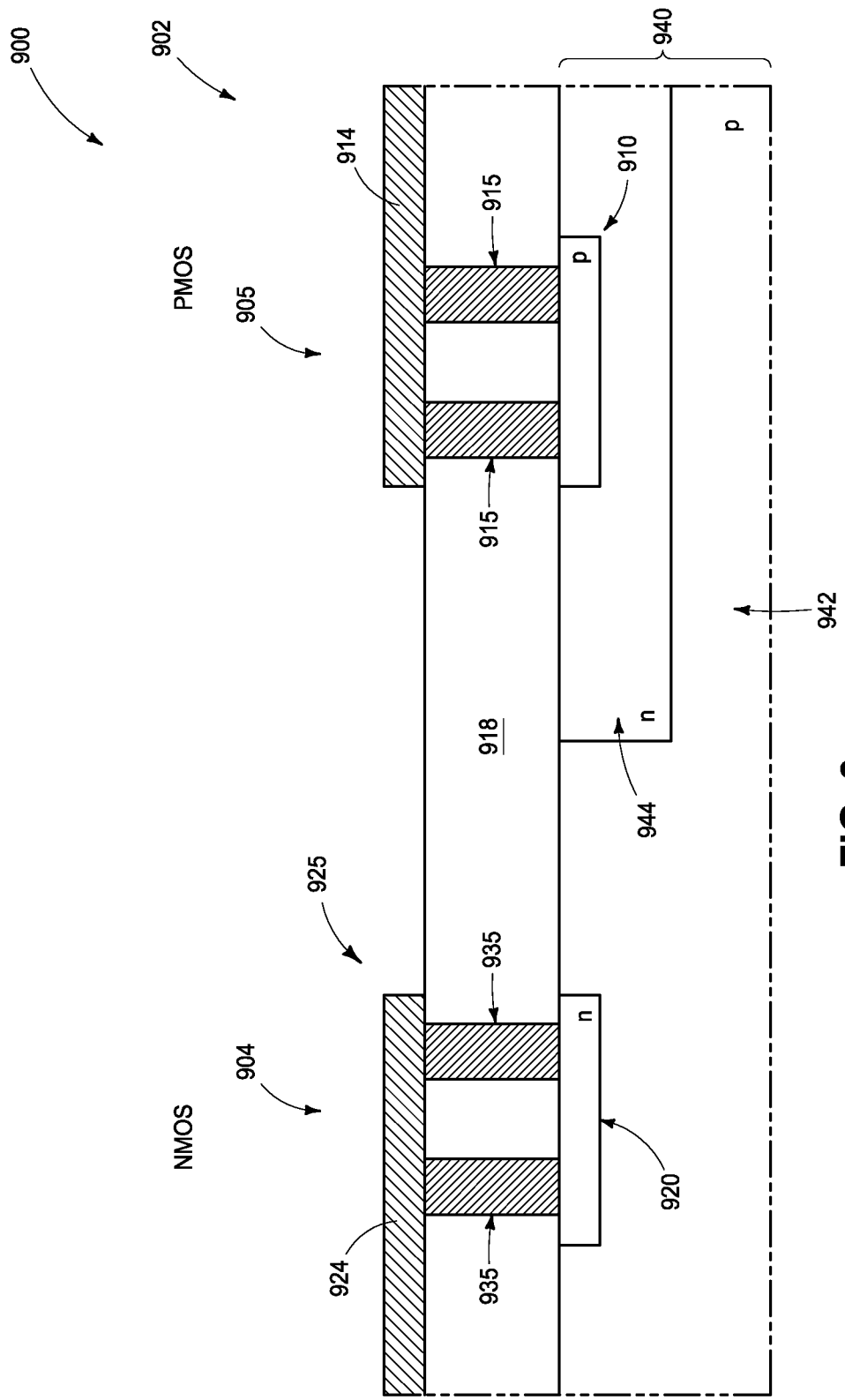

The first diffusion region 18 has a length "$L_1$" along the direction of the gate width (i.e., along axis 5), and the second and third diffusion regions 17 and 19 have lengths "$L_2$" along the direction of the gate width. In some embodiments, a difference between the lengths $L_1$ and $L_2$ may be within a range of from about 3 micrometers (μm) to about 100 μm; within a range of from about 3 μm to about 50 μm; within a range of from about 3 μm to about 10 μm; within a range of from about 10 μm to about 100 μm; etc. The utilization of a middle diffusion region having a different length relative to outer diffusion regions in the construction of FIGS. 4-7 is an improvement which may reduce parasitic resistance on a source side of a transistor as compared to the prior art construction of FIGS. 1-3 in which the three source/drain regions 910-912 have the same lengths as one another.

The gate electrodes 16 and diffusion regions 17-19 together form a PMOS transistor 20 (i.e., PMOS device, PMOS construction, etc.), which is approximately demarcated with a dashed line 21.

Each of the diffusion regions 17-19 has opposing edges on each side of its length. Specifically, diffusion region 17 has opposing edges 22 and 23, diffusion region 18 has opposing edges 24 and 25, and diffusion region 19 has opposing edges 26 and 27. The PMOS transistor may be considered to have a first side 28 defined by one set of the opposing edges (for instance, edges 22, 24 and 26), and to have a second side 30 defined by a second set of the opposing edges (for instance, edges 23, 25 and 27). In the embodiment of FIGS. 4-7, both of the first and second sides 28 and 30 have edges of the second diffusion region 18 (edges 24 and 25) inset relative to edges of the first and third diffusion regions 17 and 19 (edges 22, 23, 26 and 27). The inset along the first side 28 is a distance $D_1$, and the inset along the second side 30 is a distance $D_2$. In the shown embodiment, the distances $D_1$ and $D_2$ are about the same as one another, and accordingly the PMOS may be referred to as being H-shaped. In other embodiments, distances $D_1$ and $D_2$ may vary relative to one another. In the illustrated embodiment, the distances $D_1$ and $D_2$ may be within a range of from about 1.5 μm to about 50 μm; within a range of from about 1.5 μm to about 25 μm; within a range of from about 1.5 μm to about 10 μm; within a range of from about 5 μm to about 50 μm; etc.

Wiring 32 (for instance, WLIC1 connected to power supply voltage Vdd) is provided proximate the PMOS transistor 20, and is electrically coupled to the outer source/drain regions 17 and 19 through contacts 33. Additional wiring 34 (for instance, WLIC3) connects to the inner source/drain region 18 through contacts 35. The contacts 33 and 35 may extend through insulative material 36 (shown in FIGS. 5-7). Such insulative material may comprise any suitable composition or combination of compositions; and in some embodiments may comprise, for example, one or both of silicon dioxide and silicon nitride.

In the illustrated embodiment, there are more contacts extending to the longer outer diffusion regions 17 and 19 than to the shorter inner diffusion region 18; and specifically there are three contacts 33 to each of the outer diffusion regions, and two contacts 35 to the inner diffusion region. In some embodiments, the inner diffusion region is a drain region and the outer diffusion regions are source regions. The drain region is placed on a side which is to be driven, and accordingly its load capacity may be set to a low level. Accordingly, the inner diffusion region may be smaller and have fewer contacts than the outer diffusion regions.

The NMOS region 14 includes a pair of gate electrodes 36, and includes diffusion regions 37-39 adjacent the gate electrodes. The electrodes 36 may be electrically coupled with one another, or may be operated independently of one another.

The region 38 may be referred to as a first diffusion region between electrodes 36, and the regions 37 and 39 may be referred to as second and third diffusion regions on opposing sides of the electrodes 36. The diffusion regions 37 and 39 sandwich the electrodes 36 and the first diffusion region 38 between them. In some embodiments, the regions 37-39 may be referred to as fourth-sixth diffusion regions, respectively, in that the regions 17-19 of the PMOS are already referred to as the first-third diffusion regions.

The diffusion regions 37-39 correspond to source/drain regions. The diffusion region 38 is a first kind corresponding to either a source region or a drain region, and the diffusion regions 37 and 39 are both a second kind, different from the first kind, and corresponding to either source regions or drain regions. For instance, in some applications diffusion region 38 is a drain region, and diffusion regions 37 and 39 are source regions.

The electrodes 36 have gate widths "$W_1$" extending along the direction corresponding to the axis 5. In the shown embodiment, both electrodes have about the same gate width as one another. In some embodiments, the width $W_1$ of the gate electrodes of NMOS device 40 may be referred to as a second width to distinguish it from the first width W of the gate electrodes of the PMOS device 20, The diffusion region 38 has a length "$L_3$" along the direction of the gate width $W_1$ (i.e., along axis 5), and the diffusion regions 37 and 39 have lengths "$L_4$" along the direction of the gate width. In some embodiments, a difference between the lengths $L_3$ and $L_4$ may be within a range of from about 3 μm to about 100 μm; within a range of from about 3 μm to about 50 μm; within a range of from about 3 μm to about 10 μm; within a range of from about 10 μm to about 100 μm; etc. The utilization of a middle diffusion region having a different length relative to outer diffusion regions may reduce parasitic resistance on a source side of a transistor as compared to conventional constructions.

The gate electrodes 36 and diffusion regions 37-39 together form an NMOS transistor 40 (i.e., NMOS device, NMOS construction, etc.), which is approximately demarcated with a dashed line 41.

Each of the diffusion regions 37-39 has opposing edges on each side of its length. Specifically, diffusion region 37 has opposing edges 42 and 43, diffusion region 38 has opposing edges 44 and 45, and diffusion region 39 has opposing edges 46 and 47. The NMOS transistor may be considered to have a first side 48 defined by one set of the opposing edges (for instance, edges 42, 44 and 46), and to have a second side 50 defined by a second set of the opposing edges (for instance, edges 43, 45 and 47). In the embodiment of FIGS. 4-7, both of the first and second sides 48 and 50 have edges of the second diffusion region 38 (edges 44 and 45) inset relative to edges of the first and third diffusion regions 37 and 39 (edges 42, 43, 46 and 47). The inset along the first side 48 is a distance $D_3$, and the inset along the second side 50 is a distance $D_4$. In the shown embodiment, the distances $D_3$ and $D_4$ are about the same as one another, and accordingly the NMOS may be referred to as being H-shaped. In other embodiments, distances $D_3$ and $D_4$ may vary relative to one another. In the illustrated embodiment, the distances $D_3$ and $D_4$ may be within a range of from about 1.5 µm to about 50 µm; within a range of from about 1.5 µm to about 25 µm; within a range of from about 1.5 µm to about 10 µm; within a range of from about 5 µm to about 50 µm; etc.

Wiring 52 (for instance, WLIC2 connected to power supply voltage Vss) is provided proximate the NMOS transistor 40, and is electrically coupled to the outer source/drain regions 37 and 39 through contacts 53. Additional wiring 54 (for instance, WLIC3) connects to the inner source/drain region 38 through contacts 55.

In the illustrated embodiment, there are more contacts extending to the longer outer diffusion regions 37 and 39 than to the shorter inner diffusion region 38; and specifically there are three contacts 53 to each of the outer diffusion regions, and two contacts 55 to the inner diffusion region. In some embodiments, the inner diffusion region is a drain region and the outer diffusion regions are source regions. The drain region is placed on a side which is to be driven, and accordingly its load capacity may be set to a low level. Accordingly, the inner diffusion region may be smaller and have fewer contacts than the outer diffusion regions.

In some embodiments, wirings 32 and 52 may comprise first and second wiring lines, respectively. Such wiring lines may supply first and second power voltages, respectively. The first and second power voltages may be different relative to one another during operation of the construction comprising the PMOS device 12 and NMOS device 14.

In some embodiments, the wiring 34 of PMOS device 20 and the wiring 54 of NMOS device 40 correspond to a common wiring line. Accordingly, in some embodiments the contacts 33 couple outer diffusion regions 17 and 19 of PMOS device 20 to a first wiring line 32, the contacts 53 couple outer diffusion regions 37 and 39 of NMOS device 40 to a second wiring line 52, and the contacts 35 and 55 couple the diffusion regions 18 and 38 of the PMOS and NMOS devices to a third wiring line comprising regions 34 and 54.

Figure 5:
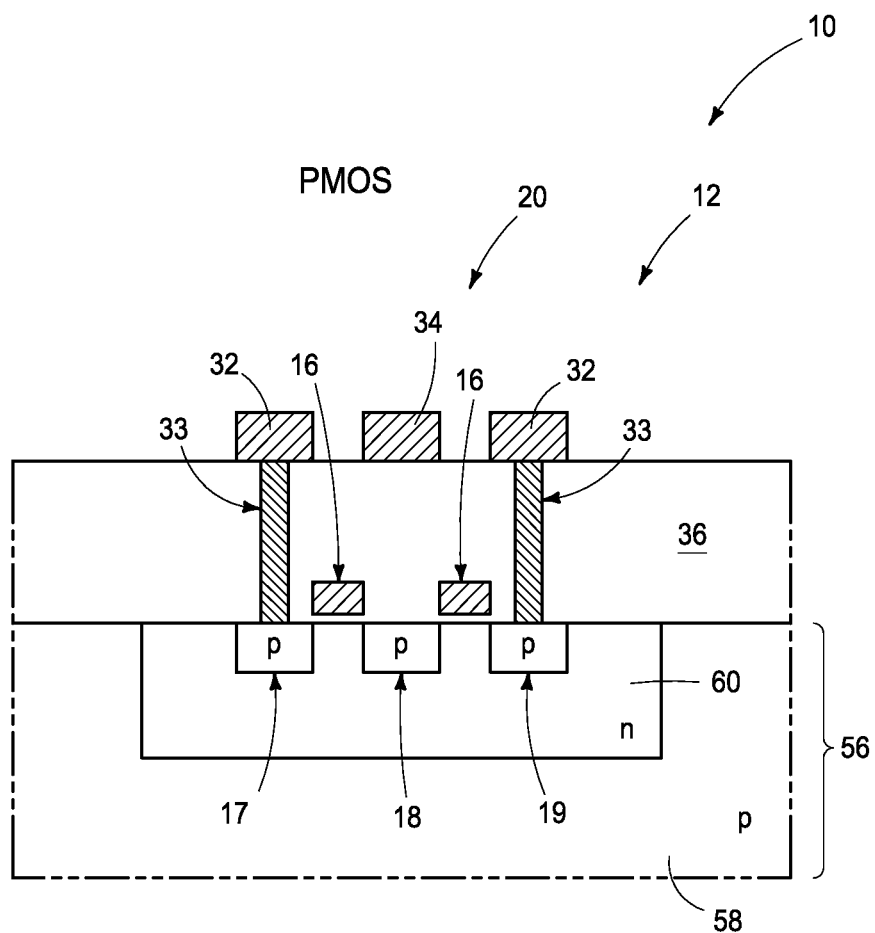
Figure 6:
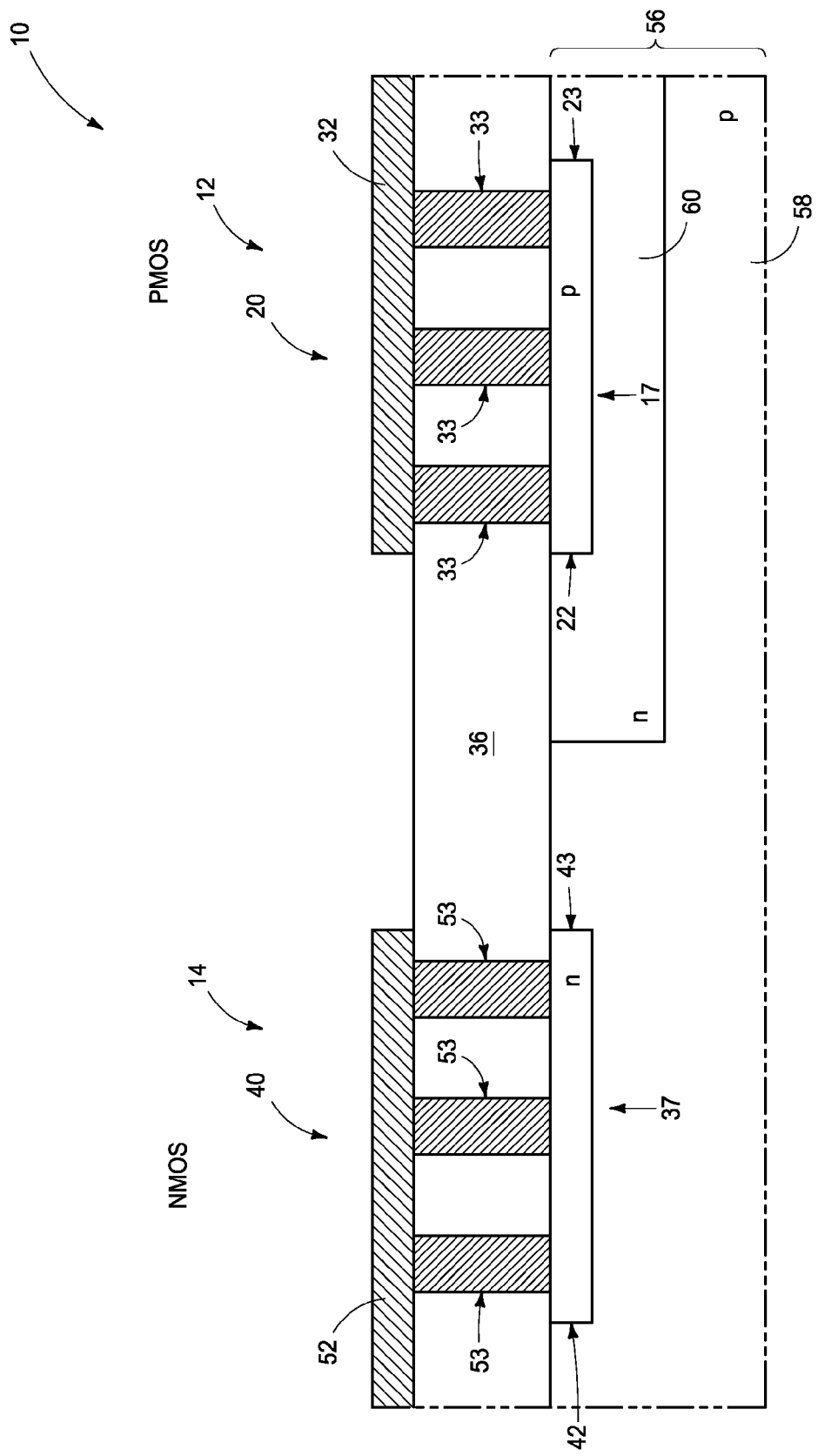
Figure 7:
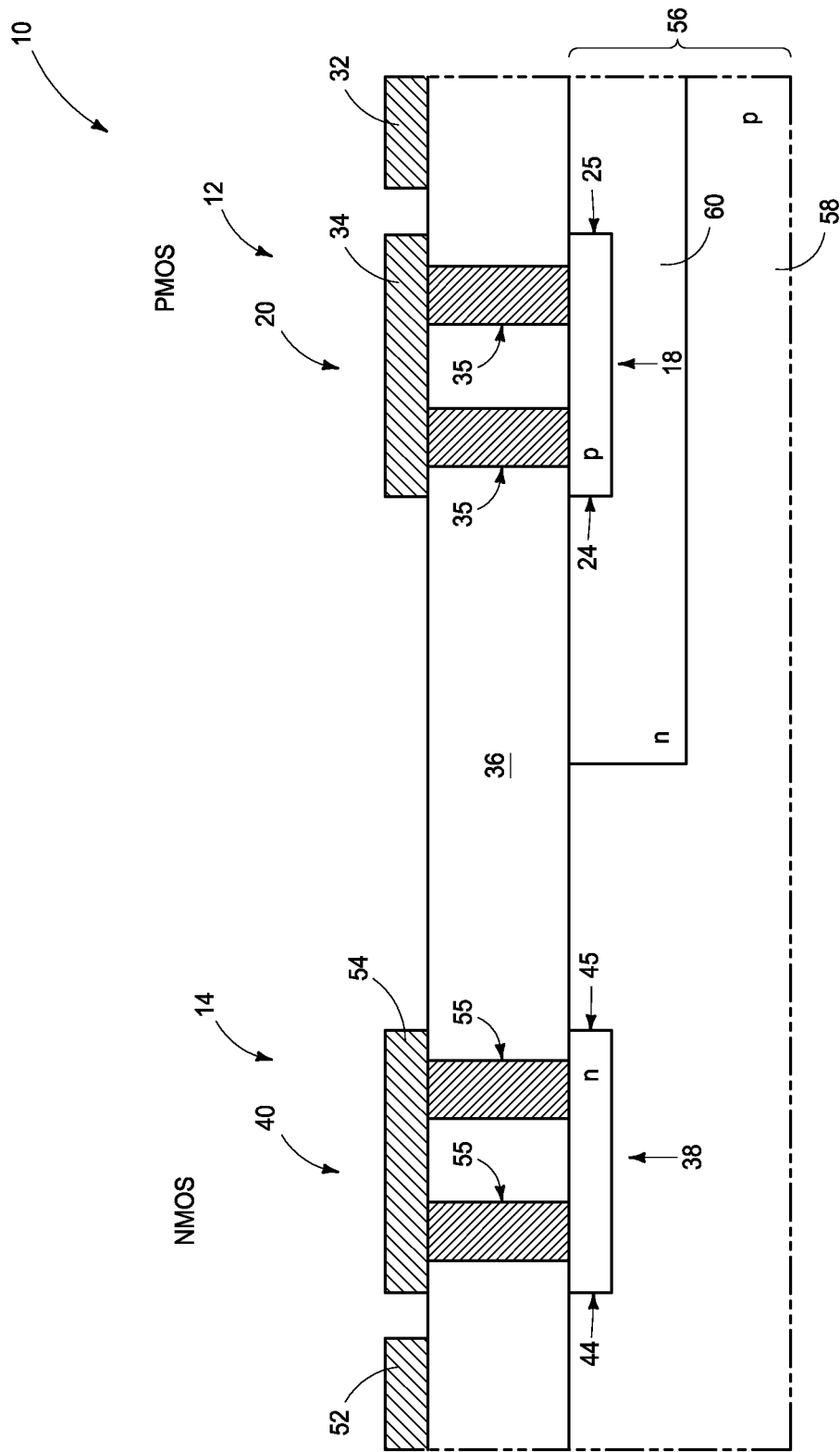

The PMOS and NMOS regions 12 and 14 are supported by a base 56 (shown in FIGS. 5-7). The base 56 may comprise semiconductor material; and may, for example, comprise, consist essentially of, or consist of monocrystalline silicon. The base 56 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 56 may correspond to a semiconductor substrate containing one or more materials associated with integrated circuit fabrication. Such materials may include, for example, one or more of refractory metal materials, barrier materials, diffusion materials, insulator materials, etc.

The semiconductor substrate 56 is shown to comprise a p-type background-doped region 58, and to comprise an n-type doped n-well 60 extending into the p-type doped region. The diffusion regions 17-19 of the PMOS device are within the n-well 60; and the diffusion regions 37-39 of the NMOS are within the p-type background-doped region 58.

The diffusion regions 17-19 of PMOS device 20 are of a first conductivity type (specifically, p-type) and the diffusion regions 37-39 of NMOS device 40 are of a second conductivity type (specifically, n-type); with the second conductivity type being different from the first conductivity type.

Figure 8:
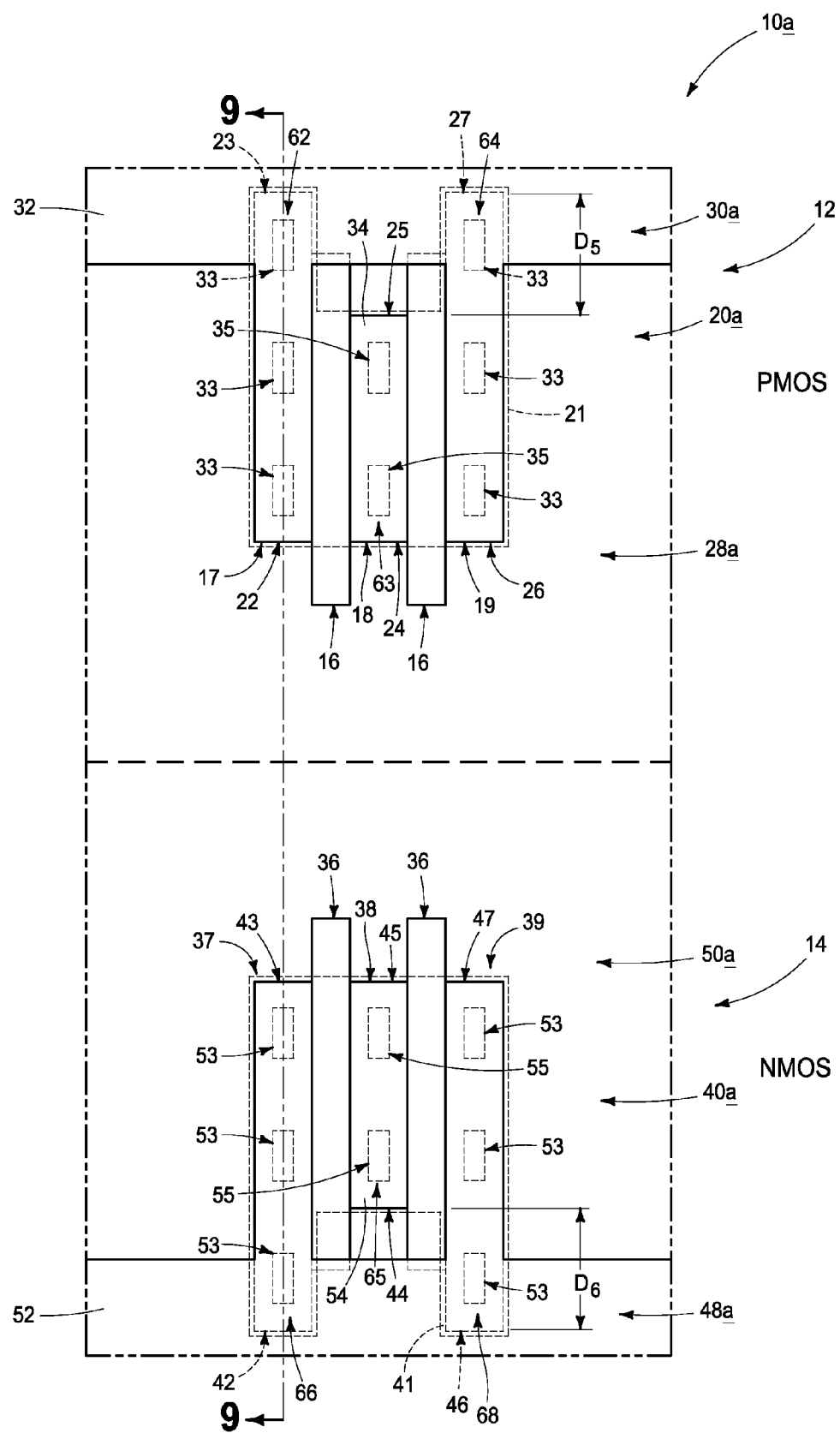
FIGS. 8 and 9 are views of another example embodiment semiconductor device.
Figure 9:
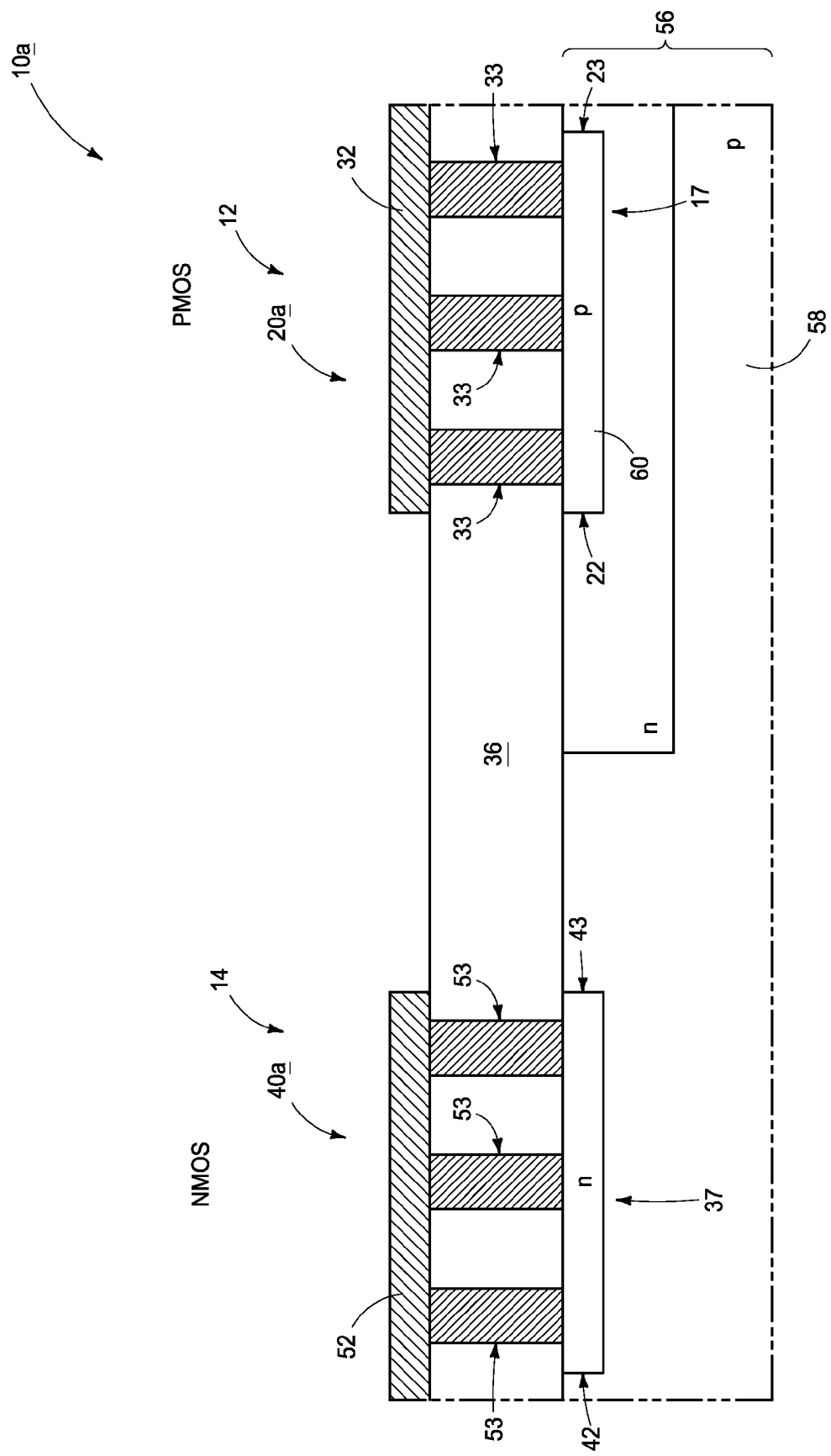

FIGS. 8 and 9 show a semiconductor device 10a illustrating another embodiment. Semiconductor device (i.e., construction) 10a includes a PMOS region 12 paired with an NMOS region 14.

A PMOS device 20a is within region 12, and an NMOS device 40a is within region 14. The PMOS device comprises diffusion regions 17-19 analogous to the regions described above with reference to FIGS. 4-7, and the NMOS device comprises diffusion regions 37-39 analogous to the regions described above with reference to FIGS. 4-7. Each of the PMOS diffusion regions comprises opposing edges along the length of the region; with region 17 having edges 22 and 23, region 18 having edges 24 and 25, and region 19 having edges 26 and 27. Similarly, each of the NMOS diffusion regions comprises opposing edges along the length of the region; with region 37 having edges 42 and 43, region 38 having edges 44 and 45, and region 39 having edges 46 and 47.

The edges 22, 24 and 26 form a first side 28a of the device 20a; and the edges 23, 25 and 27 form a second side 30a of the device 20a. Similarly, the edges 42, 44 and 46 form a first side 48a of the device 40a, and the edges 43, 45 and 47 form a second side 50a of the device 40a.

The construction 10a of FIGS. 8 and 9, like the construction 10 of FIGS. 4-7, has the middle diffusion regions of the PMOS and NMOS devices (regions 18 and 38) shorter than the outer diffusion regions of the devices (regions 17, 19, 37 and 39).

Figure 4:
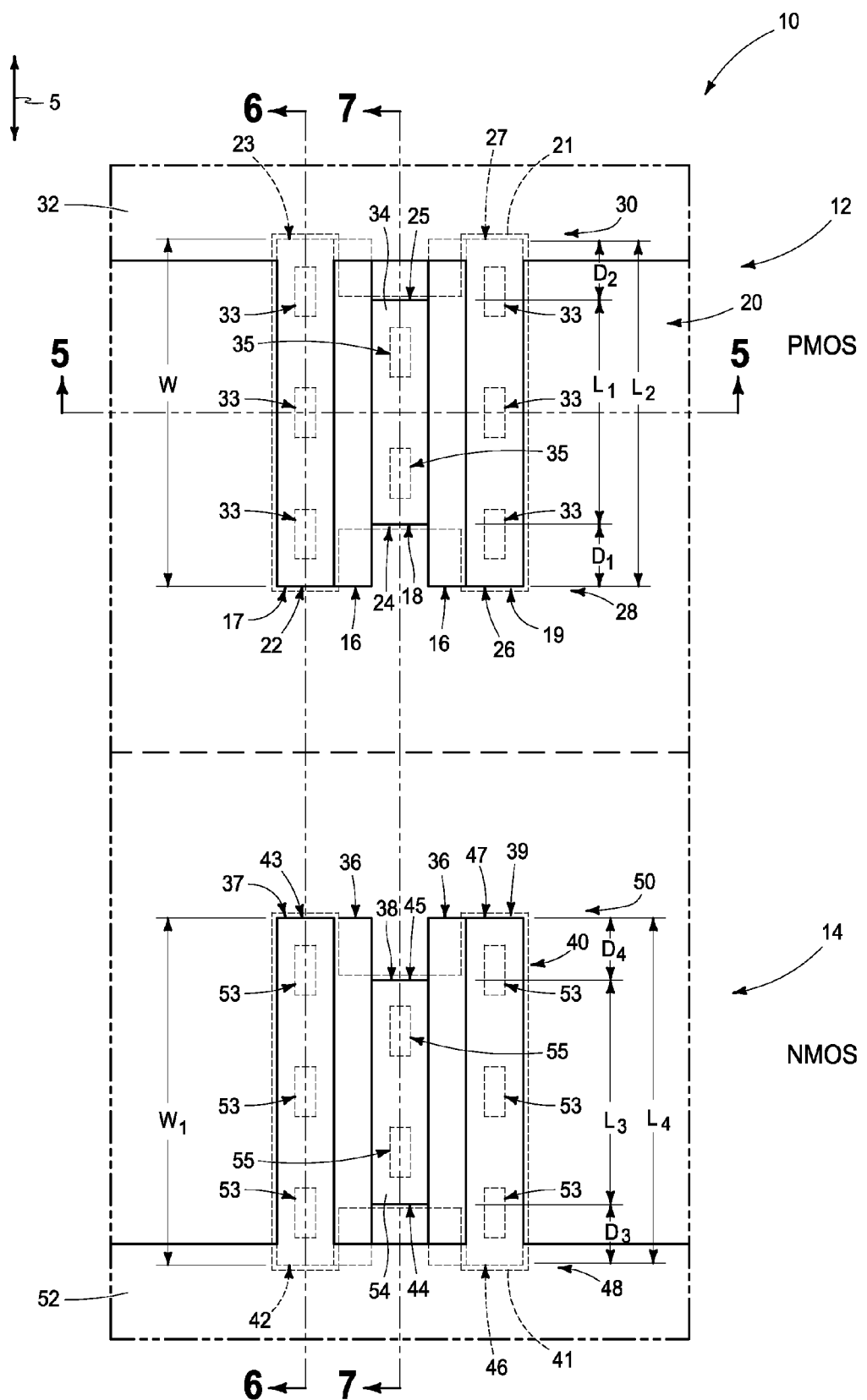
FIGS. 4-7 are views of an example embodiment semiconductor device.

A difference between the construction of FIGS. 8 and 9 relative to that of FIGS. 4-7 is that the edges along first side 28a of the PMOS device 20a are approximately even with one another (i.e., are offset from one another by less than or equal to about 2 µm; in some embodiments offset from one another by less than or equal to about 1 µm; and in some embodiments offset from one another by less than or equal to about 0.5 µm), rather than being staggered like the edges along the first side 28 of the PMOS device 20 (FIG. 4). The edges along the second side 30a of PMOS device 20a are staggered similarly to the edges along the second side 30 of PMOS device 20 (FIG. 4), with diffusion region 18 of device 20a being inset relative to diffusion regions 17 and 19 by a distance $D_5$. However, $D_5$ of FIG. 8 may be about twice as large as $D_2$ of FIG. 4 due to there being very little inset (in some embodiments, no inset or even some minor outset) along the side 28a of device 20a. For instance, $D_5$ may be within a range of from about 3 µm to about 100 µm; within a range of from about 3 µm to about 50 µm; within a range of from about 3 µm to about 20 µm; within a range of from about 10 µm to about 100 µm; etc.

Another difference between the construction of FIGS. 8 and 9 relative to that of FIGS. 4-7 is that the edges along second side 50a of the NMOS device 40a are approximately even with one another (i.e., are offset from one another by less than or equal to about 2 µm; in some embodiments offset from one another by less than or equal to about 1 µm; and in some embodiments offset from one another by less than or equal to about 0.5 µm), rather than being staggered like the edges along the second side 50 of the NMOS device 40 (FIG. 4). The edges along the first side 48a of NMOS device 40a are staggered similarly to the edges along the first side 48 of NMOS device 40 (FIG. 4), with diffusion region 38 of device 40a being inset relative to diffusion regions 37 and 39 by a distance $D_6$. However, $D_6$ of FIG. 8 may be about twice as large as $D_3$ of FIG. 4 due to there being very little inset (in some embodiments, no inset or even some minor outset)

along the side 50a of device 20a. For instance, $D_6$ may be within a range of from about 3 nm to about 100 µm; within a range of from about 3 µm to about 50 µm; within a range of from about 3 µm to about 20 µm; within a range of from about 10 µm to about 100 µm; etc.

Whereas the PMOS and NMOS devices 20 and 40 of the construction 10 of FIG. 4 may be referred to as being H-shaped, those of construction 10a of FIG. 8 (i.e., devices 20a and 40a) may be referred to as being U-shaped or concave-shaped. In some embodiments, the construction 10a of FIG. 8 may enable higher integration than the construction 10 of FIG. 4, at least in part due to increased overlap of the wirings 32 and 52 across source/drain diffusion regions of transistor devices 20a and 40a. It can be desired to maintain the illustrated gaps between inner diffusion regions 18 and 38 and the respective wirings 32 and 52 to avoid undesired deterioration of transistor characteristics.

In the embodiment of FIG. 8, the contacts 33 within outer diffusion regions 17 and 19 of PMOS device 20a are arranged in single columns 62 and 64; and similarly the contacts 53 within outer diffusion regions 37 and 39 of NMOS device 40a are arranged in single columns 66 and 68. Also, the contacts 35 within inner diffusion region 18 of the PMOS device arranged in a single column 63, and the contacts within inner diffusion region 38 of the NMOS device are arranged in a single column 65. Such is one of many possible arrangements of the various contacts 33, 35, 53 and 55. Another arrangement is described with reference to FIG. 10.

Figure 10:
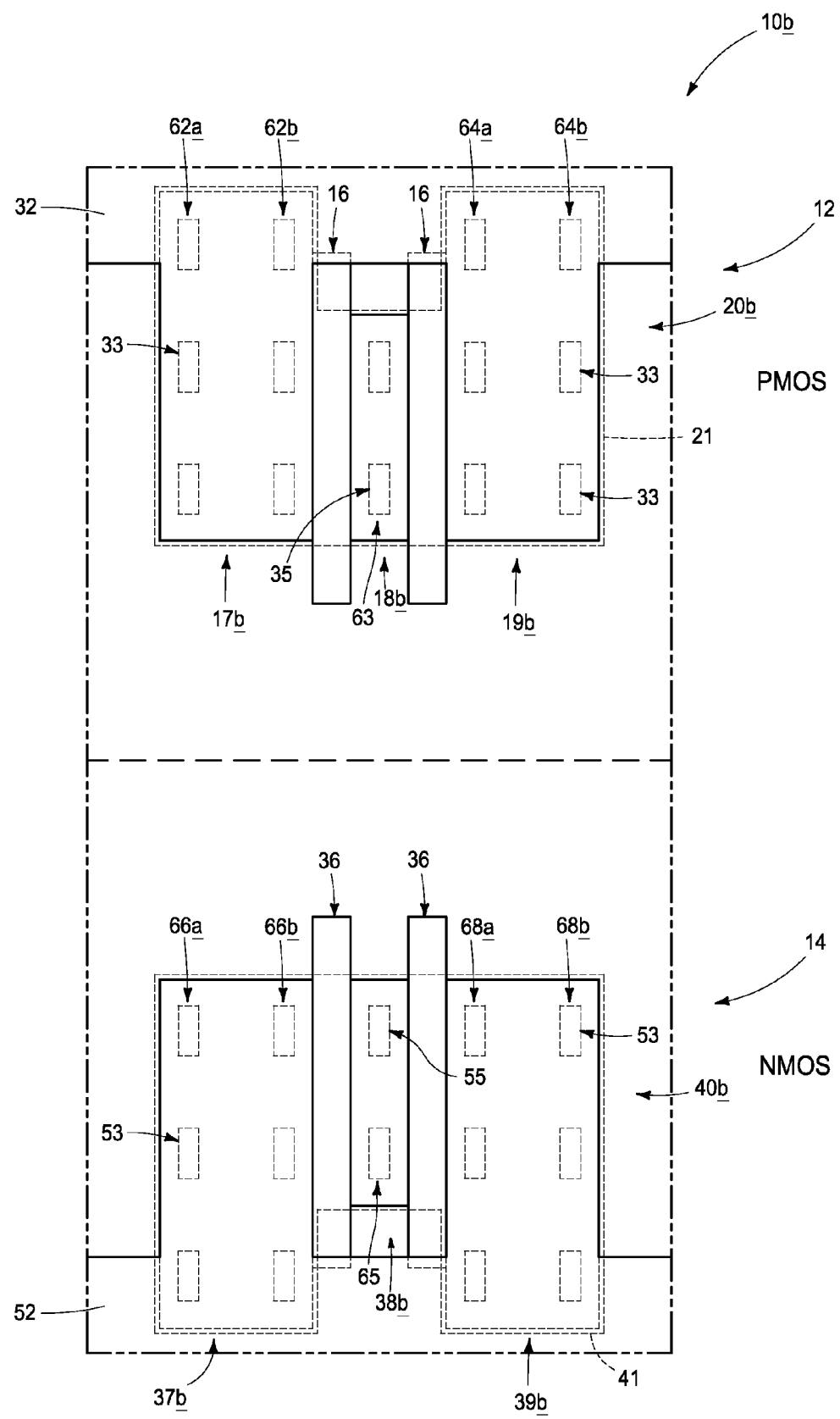
FIG. 10 is a diagrammatic top view of another example embodiment semiconductor device.

Specifically, FIG. 10 shows a construction 10b comprising PMOS and NMOS devices 20b and 40b similar to the devices 20a and 40a of FIG. 8. However, the contacts 33 within diffusion regions 17b and 19b of the PMOS device are arranged in multiple columns 62a, 62b, 64a and 64b; and similarly the contacts 53 within diffusion regions 37b and 39b are arranged in multiple columns 66a, 66b, 68a and 68b.

In the illustrated embodiment of FIG. 10, the contacts within inner diffusion regions 18b and 38b remain arranged in single columns, but different configurations may be utilized in other embodiments.

Increasing the number of contacts to various diffusion regions by utilizing the additional columns of the embodiment of FIG. 10 may reduce resistance and/or increase speed. In some aspects, the configuration of FIG. 10 may be considered to increase the size of the outer diffusion regions (17b, 19b, 37b and 39b) by increasing the width of such outer diffusion regions; and in the shown embodiment the outer diffusion regions have both increased width and increased length as compared to the inner diffusion regions (18b and 38b)

Figure 11:
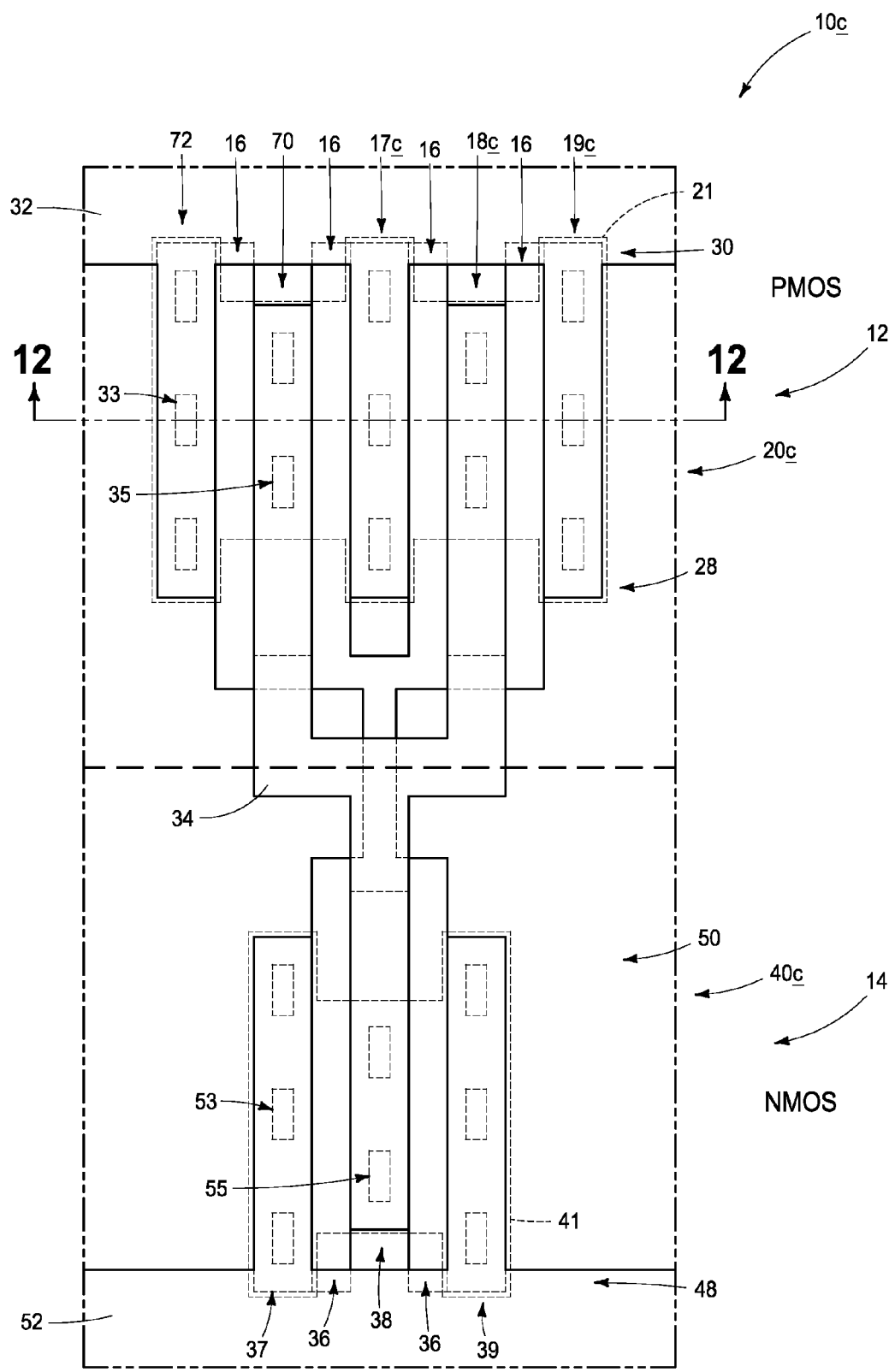
FIGS. 11 and 12 are views of another example embodiment semiconductor device.

The embodiment of FIG. 4 has an equal number of diffusion regions associated with PMOS device 20 (three) as are associated with NMOS device 40. In other embodiments, the PMOS device may have a different number of diffusion regions than the NMOS device. For instance, FIG. 11 shows an example construction 10c in which a PMOS device 20c comprises five diffusion regions, and an NMOS device 40c comprises three diffusion regions; and such construction may correspond to, for example, an inverter. The diffusion regions may be referred to as first, second, third, fourth, fifth, sixth, seventh and eighth diffusion regions. For instance, the PMOS device 20c may be considered to comprise first, second and third diffusion regions 17c-19c analogous to the regions 17-19 of FIG. 4, and the NMOS device 40c may be considered to comprise fourth, fifth and sixth diffusion regions 37-39 identical to the regions 37-39 of FIG. 4. Additionally, the PMOS device may be considered to comprise seventh and eighth diffusion regions 70 and 72, with the seventh diffusion region 70 being about the same length as diffusion region 18c, and the eighth diffusion 72 being about the same length as diffusion regions 17c and 19c.

The same wiring 34 extends across all of the shorter diffusion regions 70, 18c and 38 in the embodiment of FIG. 7; wiring 32 is connected with the longer PMOS diffusion regions 17c, 19c and 72; and wiring 52 is connected with the longer NMOS diffusion regions 37 and 29. Also, gates 16 of the PMOS device are electrically coupled with the gates 36 of the NMOS device.

It can be desired that the PMOS transistor have increased channel width as compared to the NMOS transistor due to differences in the mobility of carriers (for instance, in some embodiments the PMOS transistor may have a channel width about two-times greater than the channel width of the NMOS transistor). The arrangement of FIG. 11 may effectively create a greater channel width for the PMOS transistor.

Figure 12:
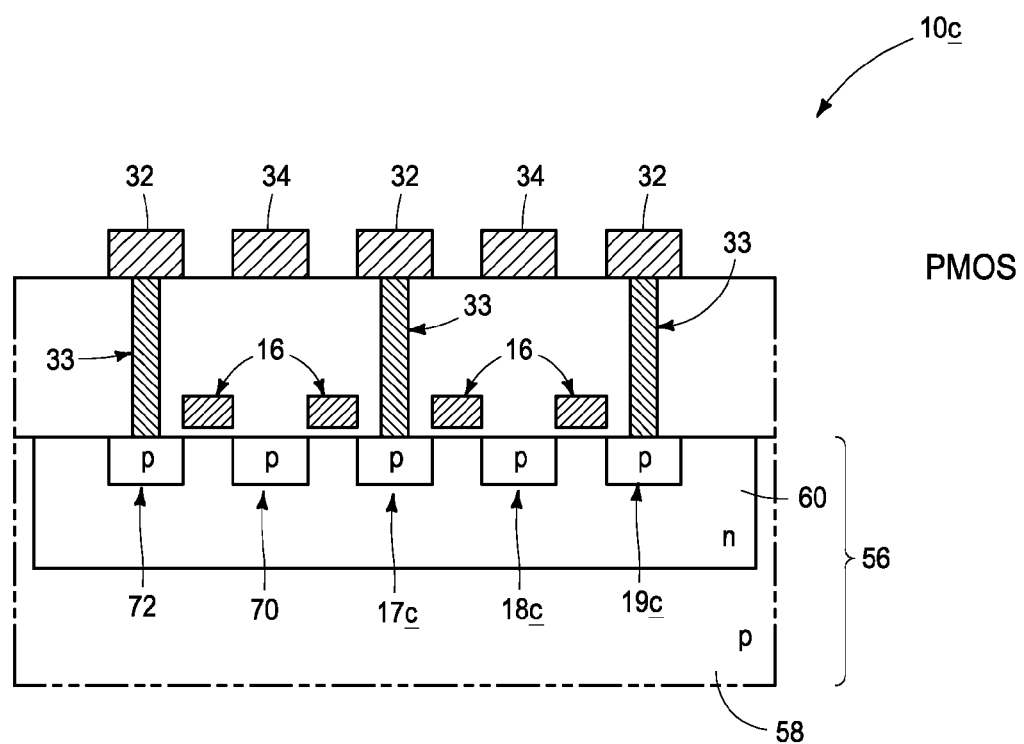

FIG. 12 shows a cross-section through the PMOS device 20c of FIG. 11 to illustrate elevational relationships of various structures.

Figure 13:
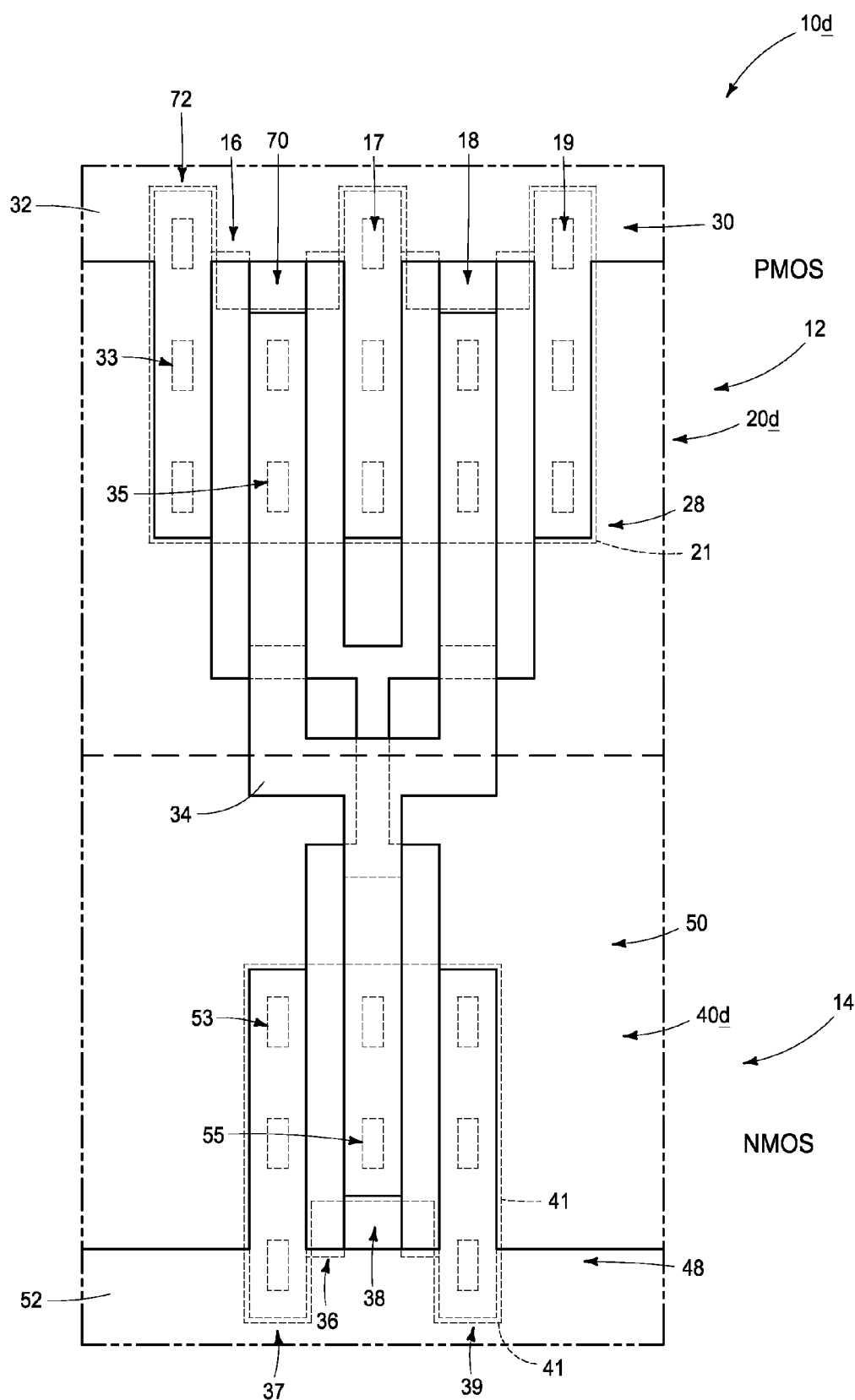
FIG. 13 is a diagrammatic top view of another example embodiment semiconductor device.

The construction of FIG. 11 comprises staggered sides 28 and 30 of the PMOS device 20c analogous to the staggered sites 28 and 30 of the construction of FIG. 4, and comprises staggered sides 48 and 50 of NMOS construction 40c analogous to the staggered sides 48 and 50 of the construction of FIG. 4. In other embodiments, constructions similar to that of FIG. 11 may be formed to have even sides analogous to those described above with reference to FIG. 8. For instance, FIG. 13 shows a construction 10d having PMOS and NMOS structures 20d and 40d analogous to the structures 20c and 40c of FIG. 11, but having even sides 28 and 50 rather than the staggered sides shown in FIG. 11.

Figure 14:
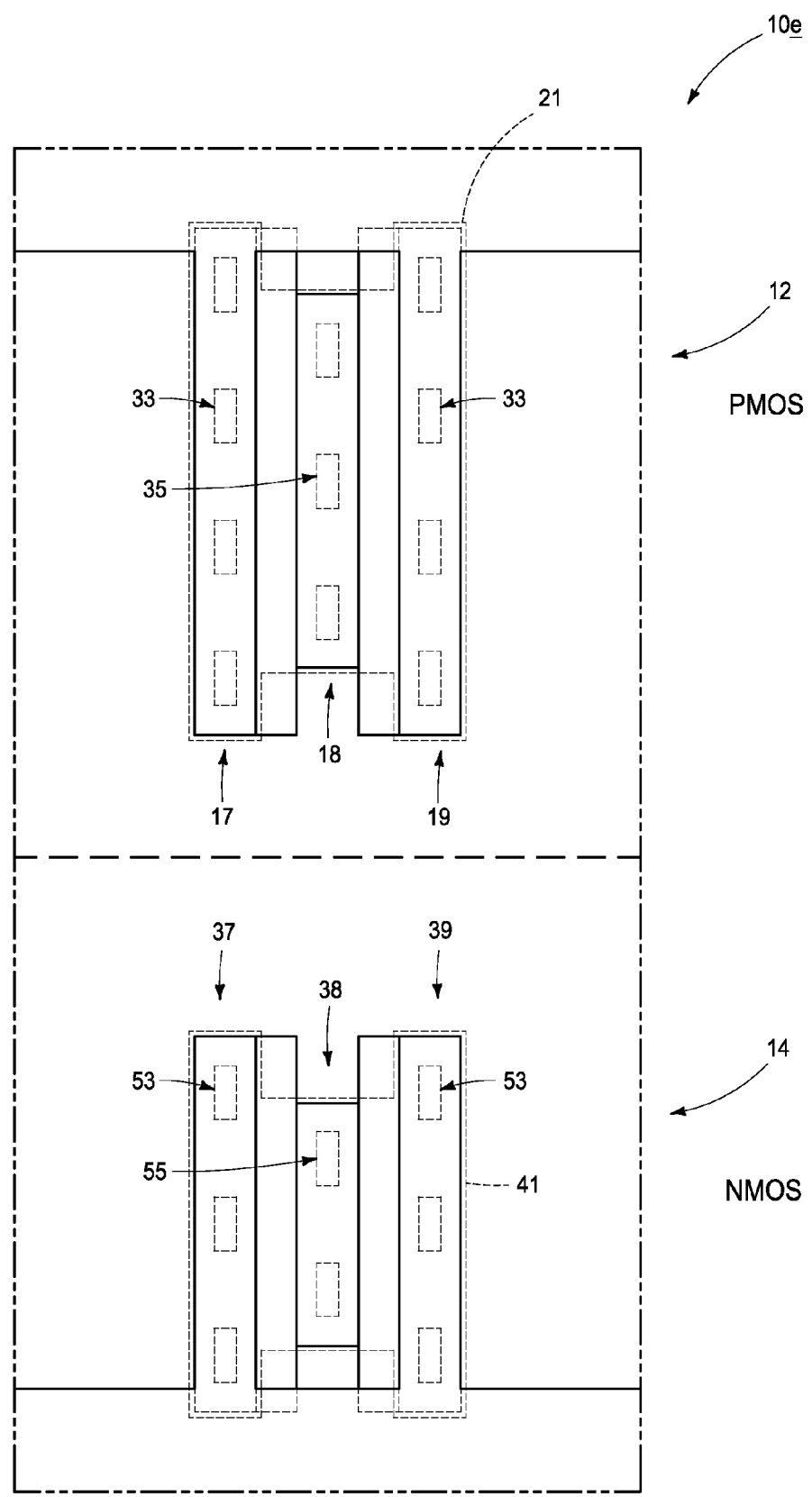
FIG. 14 is a diagrammatic top view of another example embodiment semiconductor device.

The embodiment of FIG. 4 comprises an equal number of contacts within NMOS regions 37, 38 and 39 as are in PMOS regions 17, 18 and 19, respectively. In other embodiments, the NMOS and PMOS regions may have other configurations. For instance, FIG. 14 shows a construction 10e which is analogous to the construction 10 of FIG. 4, but in which regions 17, 18 and 19 are longer than regions 37, 38 and 39, respectively; and have more contacts than regions 37, 38 and 39, respectively (i.e., more contacts 33 and 35 to the respective regions than there are contacts 53 and 55 to the respective regions). The embodiment of FIG. 14 may enable, for example, a PMOS device to be formed with a larger channel width than an adjacent NMOS device, or vice versa.

Figure 15:
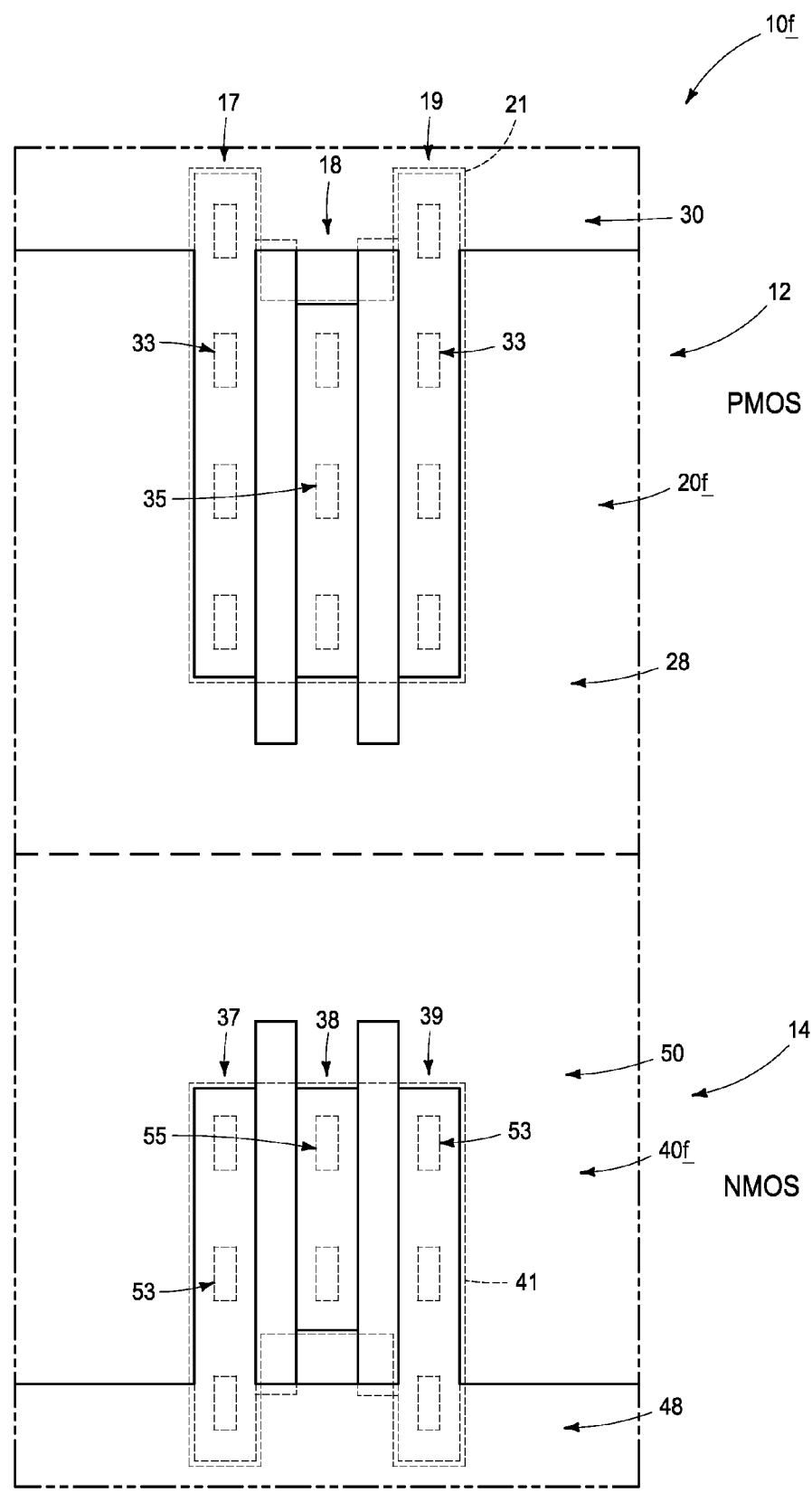
FIG. 15 is a diagrammatic top view of another example embodiment semiconductor device.

The construction 10e FIG. 14 comprises staggered sides of the PMOS and NMOS transistors analogous to the staggered sides 28, 30, 48 and 50 of FIG. 4. FIG. 15 shows another example embodiment, and specifically shows a construction 10f similar to the construction of FIG. 14 but in which each of the PMOS and NMOS transistors has a non-staggered (i.e., even) side analogous to the construction described above with reference to FIG. 8.

In some embodiments, the number of contacts to various diffusion regions may be tailored to achieve desired speed/voltage characteristics, while also striving to keep device footprint small.

Various aspects of the above-described embodiments may be combined with one another. For instance, diffusion regions of the embodiments of FIGS. 11, 13, 14 and 15 may have increased width as well as length (i.e., may include aspects shown in FIG. 10) in some embodiments.

The devices discussed above may be incorporated into electronic systems. Such electronic systems may be used in, for example, logic, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a semiconductor device having two gate electrodes which are of about a same gate width as one another, and a first diffusion region between the two gate electrodes. The first diffusion region is a first source/drain region. The semiconductor devices also has second and third diffusion regions on opposing sides of the two gate electrodes from one another and which sandwich the two gate electrodes and the first source/drain region therebetween. The second and third diffusion regions are second and third source/drain regions, respectively. The first source/drain region is a first kind of region corresponding to either a source region or a drain region. The second and third source/drain regions are a second kind of region different from the first kind and either both being source regions or both being drain regions. Each of the second and third diffusion regions is longer than the first diffusion region in a direction of the gate width.

Some embodiments include a semiconductor device comprising a PMOS construction and an NMOS construction. The PMOS construction includes two first gate electrodes having a first gate width, a first diffusion region between the first gate electrodes, and second and third diffusion regions on opposing sides of the first gate electrodes from one another and which sandwich the first gate electrodes and the first diffusion region therebetween. Each of the second and third diffusion regions is longer than the first diffusion region in a direction of the first gate width. The NMOS construction includes two second gate electrodes having a second gate width, a fourth diffusion region between the second gate electrodes, and fifth and sixth diffusion regions on opposing sides of the second gate electrodes from one another and which sandwich the second gate electrodes and the fourth diffusion region therebetween. Each of the fifth and sixth diffusion regions is longer than the fourth diffusion region in a direction of the second gate width.

Some embodiments include a semiconductor device comprising a first wiring line extending along a first direction, a second wiring line extending along the first direction, a PMOS construction, and an NMOS construction. The PMOS construction includes a first transistor having two first gate electrodes of about a same gate width as one another, with the gate width of the two first gate electrodes being a first gate width. The PMOS construction also includes a first diffusion region between the two first gate electrodes, and second and third diffusion regions on opposing sides of the two first gate electrodes from one another and which sandwich the two first gate electrodes and the first diffusion region therebetween. Each of the second and third diffusion regions is longer than the first diffusion region in a direction of the first gate width. The first, second and third diffusion regions are of a first conductivity type. The second and third diffusion regions are electrically coupled with the first wiring line. The NMOS construction includes a second transistor having two second gate electrodes of about a same gate width as one another, with the gate width of the two second gate electrodes being a second gate width. The NMOS construction also includes a fourth diffusion region between the two second gate electrodes, and fifth and sixth diffusion regions on opposing sides of the two second gate electrodes from one another and which sandwich the two second gate electrodes and the fourth diffusion region therebetween. Each of the fifth and sixth diffusion regions is longer than the fourth diffusion region in a direction of the second gate width. The fourth, fifth and sixth diffusion regions are of a second conductivity type different from the first conductivity type. The fifth and sixth diffusion regions are electrically coupled with the second wiring line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor device comprising:
    two gate electrodes, the gate electrodes being of about a same gate width as one another;
    a first diffusion region between the two gate electrodes, and being a first source/drain region;
    second and third diffusion regions on opposing sides of the two gate electrodes from one another and which sandwich the two gate electrodes and the first source/drain region therebetween; the second and third diffusion regions being second and third source/drain regions, respectively; the first source/drain region being a first kind of region corresponding to either a source region or a drain region; the second and third source/drain regions being a second kind of region different from the first kind and either both being source regions or both being drain regions;

each of the second and third diffusion regions being
    longer than the first diffusion region in a direction of the
    gate width;
wherein multiple contacts extend to each of the first,
    second and third diffusion regions;
wherein there are more contacts extending to the second
    and third diffusion regions than to the first diffusion
    region; and
wherein said direction of the gate width is a length
    direction of the first, second and third diffusion regions;
wherein each of the first, second and third diffusion
    regions has opposing edges on each side of its length,
    with the device having a first side defined by one set of
    edges of the first, second and third diffusion regions,
    and having a second side defined by another set of
    edges of the first, second and third diffusion regions;
    and wherein both of the first and second sides have
    edges of the first diffusion region inset relative to edges
    of the second and third diffusion regions.

2. The semiconductor device of claim 1 wherein the contacts extending to the first diffusion region are aligned along a single column.

3. The semiconductor device of claim 2 wherein the contacts extending to the second and third diffusion regions are aligned along single columns.

4. A semiconductor device comprising:
two gate electrodes, the gate electrodes being of about a
    same gate width as one another;
a first diffusion region between the two gate electrodes,
    and being a first source/drain region;
second and third diffusion regions on opposing sides of
    the two gate electrodes from one another and which
    sandwich the two gate electrodes and the first source/
    drain region therebetween; the second and third diffu-
    sion regions being second and third source/drain
    regions, respectively; the first source/drain region being
    a first kind of region corresponding to either a source
    region or a drain region; the second and third source/
    drain regions being a second kind of region different
    from the first kind and either both being source regions
    or both being drain regions;
each of the second and third diffusion regions being
    longer than the first diffusion region in a direction of the
    gate width;
wherein multiple contacts extend to each of the first,
    second and third diffusion regions;
wherein there are more contacts extending to the second
    and third diffusion regions than to the first diffusion
    region;
wherein the contacts extending to the first diffusion region
    are aligned along a single column; and
wherein the contacts extending to the second and third
    diffusion regions are aligned along multiple columns.

5. A semiconductor device comprising:
a PMOS construction, comprising:
    two first gate electrodes having a first gate width;
    a first diffusion region between the first gate electrodes;
    second and third diffusion regions on opposing sides of
        the first gate electrodes from one another and which
        sandwich the first gate electrodes and the first dif-
        fusion region therebetween; and
    each of the second and third diffusion regions being
        longer than the first diffusion region in a direction of
        the first gate width; and
an NMOS construction, comprising:
    two second gate electrodes having a second gate width;
    a fourth diffusion region between the second gate
        electrodes;
    fifth and sixth diffusion regions on opposing sides of
        the second gate electrodes from one another and
        which sandwich the second gate electrodes and the
        fourth diffusion region therebetween;
each of the fifth and sixth diffusion regions being longer
    than the fourth diffusion region in a direction of the
    second gate width; and
wherein multiple contacts extend to each of the first,
    second and third diffusion regions; and wherein there
    are more contacts extending to the second and third
    diffusion regions than to the first diffusion region.

6. A semiconductor device comprising:
a PMOS construction, comprising:
    two first gate electrodes having a first gate width;
    a first diffusion region between the first gate electrodes;
    second and third diffusion regions on opposing sides of
        the first gate electrodes from one another and which
        sandwich the first gate electrodes and the first dif-
        fusion region therebetween; and
    each of the second and third diffusion regions being
        longer than the first diffusion region in a direction of
        the first gate width; and
an NMOS construction, comprising:
    two second gate electrodes having a second gate width;
    a fourth diffusion region between the second gate
        electrodes;
    fifth and sixth diffusion regions on opposing sides of
        the second gate electrodes from one another and
        which sandwich the second gate electrodes and the
        fourth diffusion region therebetween;
each of the fifth and sixth diffusion regions being longer
    than the fourth diffusion region in a direction of the
    second gate width; and
wherein multiple contacts extend to each of the fourth,
    fifth and sixth diffusion regions; and wherein there are
    more contacts extending to the fifth and sixth diffusion
    regions than to the fourth diffusion region.

7. A semiconductor device comprising:
a PMOS construction, comprising:
    two first gate electrodes having a first gate width;
    a first diffusion region between the first gate electrodes;
    second and third diffusion regions on opposing sides of
        the first gate electrodes from one another and which
        sandwich the first gate electrodes and the first dif-
        fusion region therebetween; and
    each of the second and third diffusion regions being
        longer than the first diffusion region in a direction of
        the first gate width; and
an NMOS construction, comprising:
    two second gate electrodes having a second gate width;
    a fourth diffusion region between the second gate
        electrodes;
    fifth and sixth diffusion regions on opposing sides of
        the second gate electrodes from one another and
        which sandwich the second gate electrodes and the
        fourth diffusion region therebetween;
each of the fifth and sixth diffusion regions being longer
    than the fourth diffusion region in a direction of the
    second gate width; and wherein:
    multiple contacts extend to each of the first, second and
        third diffusion regions; and wherein there are more
        contacts extending to the second and third diffusion
        regions than to the first diffusion region;
    multiple contacts extend to each of the fourth, fifth and
        sixth diffusion regions; and wherein there are more contacts extending to the fifth and sixth diffusion regions than to the fourth diffusion region; and wherein the number of contacts extending to the fourth, fifth and sixth diffusion regions is the same as the number of contacts extending to the first, second and third diffusion regions, respectively.

8. A semiconductor device comprising:

a PMOS construction, comprising:
two first gate electrodes having a first gate width;
a first diffusion region between the first gate electrodes;
second and third diffusion regions on opposing sides of the first gate electrodes from one another and which sandwich the first gate electrodes and the first diffusion region therebetween; and
each of the second and third diffusion regions being longer than the first diffusion region in a direction of the first gate width; and an NMOS construction, comprising:
two second gate electrodes having a second gate width;
a fourth diffusion region between the second gate electrodes;
fifth and sixth diffusion regions on opposing sides of the second gate electrodes from one another and which sandwich the second gate electrodes and the fourth diffusion region therebetween;
each of the fifth and sixth diffusion regions being longer than the fourth diffusion region in a direction of the second gate width; and wherein:
multiple contacts extend to each of the first, second and third diffusion regions; and wherein there are more contacts extending to the second and third diffusion regions than to the first diffusion region;
multiple contacts extend to each of the fourth, fifth and sixth diffusion regions; and wherein there are more contacts extending to the fifth and sixth diffusion regions than to the fourth diffusion region; and
wherein the number of contacts extending to the fourth, fifth and sixth diffusion regions is the different from the number of contacts extending to the first, second and third diffusion regions, respectively.

9. A semiconductor device comprising:

a PMOS construction, comprising:
two first gate electrodes having a first gate width;
a first diffusion region between the first gate electrodes;
second and third diffusion regions on opposing sides of the first gate electrodes from one another and which sandwich the first gate electrodes and the first diffusion region therebetween; and
each of the second and third diffusion regions being longer than the first diffusion region in a direction of the first gate width; and an NMOS construction, comprising:
two second gate electrodes having a second gate width;
a fourth diffusion region between the second gate electrodes;
fifth and sixth diffusion regions on opposing sides of the second gate electrodes from one another and which sandwich the second gate electrodes and the fourth diffusion region therebetween;
each of the fifth and sixth diffusion regions being longer than the fourth diffusion region in a direction of the second gate width; and wherein:
said direction of the first gate width is a length direction of the first, second and third diffusion regions; wherein each of the first, second and third diffusion regions has opposing edges on each side of its length, with the PMOS construction having a first side defined by one set of edges of the first, second and third diffusion regions, and having a second side defined by another set of edges of the first, second and third diffusion regions; and wherein both of the first and second sides of the PMOS construction have edges of the first diffusion region inset relative to edges of the second and third diffusion regions; and
said direction of the second gate width is a length direction of the fourth, fifth and sixth diffusion regions; wherein each of the fourth, fifth and sixth diffusion regions has opposing edges on each side of its length, with the NMOS construction having a first side defined by one set of edges of the fourth, fifth and sixth diffusion regions, and having a second side defined by another set of edges of the fourth, fifth and sixth diffusion regions; and wherein both of the first and second sides of the NMOS construction have edges of the fourth diffusion region inset relative to edges of the fifth and sixth diffusion regions.

10. The semiconductor device of claim 9 wherein the PMOS construction includes seventh and eighth diffusion regions in addition to the first, second and third diffusion regions; the seventh diffusion region being a same length as the first diffusion region, and the eighth diffusion region being a same length as the second and third diffusion regions.

11. A semiconductor device comprising:

a PMOS construction, comprising:
two first gate electrodes having a first gate width;
a first diffusion region between the first gate electrodes;
second and third diffusion regions on opposing sides of the first gate electrodes from one another and which sandwich the first gate electrodes and the first diffusion region therebetween; and
each of the second and third diffusion regions being longer than the first diffusion region in a direction of the first gate width; and an NMOS construction, comprising:
two second gate electrodes having a second gate width;
a fourth diffusion region between the second gate electrodes;
fifth and sixth diffusion regions on opposing sides of the second gate electrodes from one another and which sandwich the second gate electrodes and the fourth diffusion region therebetween;
each of the fifth and sixth diffusion regions being longer than the fourth diffusion region in a direction of the second gate width; and wherein:
said direction of the first gate width is a length direction of the first, second and third diffusion regions; wherein each of the first, second and third diffusion regions has opposing edges on each side of its length, with the PMOS construction having a first side defined by one set of edges of the first, second and third diffusion regions, and having a second side defined by another set of edges of the first, second and third diffusion regions; wherein one of the first and second sides of the PMOS construction has all edges of the first, second and third diffusion regions approximately even with one another; and wherein the other of the first and second sides of the PMOS construction has an edge of the first diffusion region staggered relative to edges of the second and third diffusion regions; and
said direction of the second gate width is a length direction of the fourth, fifth and sixth diffusion regions; wherein each of the fourth, fifth and sixth diffusion regions has opposing edges on each side of its length, with the NMOS construction having a first side defined by one set of edges of the fourth, fifth and sixth diffusion regions, and having a second side defined by another set of edges of the fourth, fifth and sixth diffusion regions; wherein one of the first and second sides of the NMOS construction has all edges of the fourth, fifth and sixth diffusion regions approximately even with one another; and wherein the other of the first and second sides of the NMOS construction has an edge of the fourth diffusion region staggered relative to edges of the fifth and sixth diffusion regions.

12. The semiconductor device of claim 11 wherein the PMOS construction includes seventh and eighth diffusion regions in addition to the first, second and third diffusion regions; the seventh diffusion region being a same length as the first diffusion region, and the eighth diffusion region being a same length as the second and third diffusion regions; and wherein the said one of the first and second sides of the PMOS construction has all edges of the first, second, third, seventh and eighth diffusion regions approximately even with one another.

13. The semiconductor device of claim 11 wherein:
multiple contacts extend to each of the first, second and third diffusion regions; and wherein there are more contacts extending to the second and third diffusion regions than to the first diffusion region;
multiple contacts extend to each of the fourth, fifth and sixth diffusion regions; and wherein there are more contacts extending to the fifth and sixth diffusion regions than to the fourth diffusion region;
wherein the number of contacts to the fourth, fifth and sixth diffusion regions is the same as the number of contacts to the first, second and third diffusion regions, respectively; and
wherein the contacts extending to the first and fourth diffusion region are aligned along single columns.

14. The semiconductor device of claim 13 wherein the contacts extending to the second, third, fifth and sixth diffusion regions are aligned along single columns.

15. The semiconductor device of claim 13 wherein the contacts extending to the second, third, fifth and sixth diffusion regions are aligned along multiple columns.

16. A semiconductor device comprising:
a first wiring line extending along a first direction;
a second wiring line extending along the first direction;
a PMOS construction comprising:
a first transistor including two first gate electrodes of about a same gate width as one another, with the gate width of the two first gate electrodes being a first gate width; a first diffusion region between the two first gate electrodes, and second and third diffusion regions on opposing sides of the two first gate electrodes from one another and which sandwich the two first gate electrodes and the first diffusion region therebetween; each of the second and third diffusion regions being longer than the first diffusion region in a direction of the first gate width; the first, second and third diffusion regions being of a first conductivity type; the second and third diffusion regions being electrically coupled with the first wiring line; and
an NMOS construction comprising:
a second transistor including two second gate electrodes of about a same gate width as one another, with the gate width of the two second gate electrodes being a second gate width; a fourth diffusion region between the two second gate electrodes, and fifth and sixth diffusion regions on opposing sides of the two second gate electrodes from one another and which sandwich the two second gate electrodes and the fourth diffusion region therebetween; and each of the fifth and sixth diffusion regions being longer than the fourth diffusion region in a direction of the second gate width; the fourth, fifth and sixth diffusion regions being of a second conductivity type different from the first conductivity type; the fifth and sixth diffusion regions being electrically coupled with the second wiring line.

17. The semiconductor device of claim 16 wherein:
multiple contacts extend to each of the first, second and third diffusion regions, with more contacts extending to the second and third diffusion regions than to the first diffusion region; the contacts to the second and third diffusion regions coupling the second and third diffusion regions to the first wiring line; the contact to the first diffusion region coupling the first diffusion region to a third wiring line; and
wherein multiple contacts extend to each of the fourth, fifth and sixth diffusion regions, with more contacts extending to the fifth and sixth diffusion regions than to the fourth diffusion region; the contacts to the fifth and sixth diffusion regions coupling the fifth and sixth diffusion regions to the second wiring line; the contact to the fourth diffusion region coupling the fourth diffusion region to the third wiring line.

18. The semiconductor device of claim 17 wherein the number of contacts extending to the fourth, fifth and sixth diffusion regions is the same as the number of contacts extending to the first, second and third diffusion regions, respectively.

19. The semiconductor device of claim 17 wherein the number of contacts extending to the fourth, fifth and sixth diffusion regions is the different from the number of contacts extending to the first, second and third diffusion regions, respectively.

20. The semiconductor device of claim 16 wherein:
said direction of the first gate width is a length direction of the first, second and third diffusion regions; wherein each of the first, second and third diffusion regions has opposing edges on each side of its length, with the PMOS construction having a first side defined by one set of edges of the first, second and third diffusion regions, and having a second side defined by another set of edges of the first, second and third diffusion regions; and wherein both of the first and second sides of the PMOS construction have edges of the second diffusion region inset relative to edges of the first and third diffusion regions; and
said direction of the second gate width is a length direction of the fourth, fifth and sixth diffusion regions; wherein each of the fourth, fifth and sixth diffusion regions has opposing edges on each side of its length, with the NMOS construction having a first side defined by one set of edges of the fourth, fifth and sixth diffusion regions, and having a second side defined by another set of edges of the fourth, fifth and sixth diffusion regions; and wherein both of the first and second sides of the NMOS construction have edges of the fourth diffusion region inset relative to edges of the fifth and sixth diffusion regions.

21. The semiconductor device of claim 16 wherein:
said direction of the first gate width is a length direction of the first, second and third diffusion regions; wherein each of the first, second and third diffusion regions has opposing edges on each side of its length, with the PMOS construction having a first side defined by one set of edges of the first, second and third diffusion regions, and having a second side defined by another set of edges of the first, second and third diffusion regions; wherein one of the first and second sides of the PMOS construction has all edges of the first, second and third diffusion regions approximately even with one another; and wherein the other of the first and second sides of the PMOS construction has an edge of the first diffusion region staggered relative to edges of the second and third diffusion regions; and
said direction of the second gate width is a length direction of the fourth, fifth and sixth diffusion regions; wherein each of the fourth, fifth and sixth diffusion regions has opposing edges on each side of its length, with the NMOS construction having a first side defined by one set of edges of the fourth, fifth and sixth diffusion regions, and having a second side defined by another set of edges of the fourth, fifth and sixth diffusion regions; wherein one of the first and second sides of the NMOS construction has all edges of the fourth, fifth and sixth diffusion regions approximately even with one another; and wherein the other of the first and second sides of the NMOS construction has an edge of the fourth diffusion region staggered relative to edges of the fifth and sixth diffusion regions.

\* \* \* \* \*